United States Patent
Davis et al.

(10) Patent No.: US 11,885,011 B2
(45) Date of Patent: Jan. 30, 2024

(54) INFILTRATING CARBON NANOTUBES WITH CARBON TO PREVENT DELAMINATION FROM A SUBSTRATE

(71) Applicant: Brigham Young University, Provo, UT (US)

(72) Inventors: Robert Davis, Provo, UT (US); Richard Vanfleet, Provo, UT (US); Kyle Zufelt, Middleton, ID (US); David Jensen, Provo, UT (US)

( * ) Notice: Subject to any disclaimer, the term of this patent is extended or adjusted under 35 U.S.C. 154(b) by 0 days.

(21) Appl. No.: 16/854,534

(22) Filed: Apr. 21, 2020

(65) Prior Publication Data

US 2020/0248302 A1 Aug. 6, 2020

Related U.S. Application Data

(63) Continuation of application No. 13/924,154, filed on Jun. 21, 2013.

(Continued)

(51) Int. Cl.
  *B32B 9/00* (2006.01)
  *C23C 16/04* (2006.01)
  (Continued)

(52) U.S. Cl.
  CPC .......... *C23C 16/045* (2013.01); *C01B 32/158* (2017.08); *C01B 32/16* (2017.08);
  (Continued)

(58) Field of Classification Search
  CPC ....... Y10T 428/30; B32B 9/007; B82Y 30/00; B82Y 40/00
  (Continued)

(56) References Cited

U.S. PATENT DOCUMENTS

| 4,163,900 A | 8/1979 | Warren et al. |
| 4,250,127 A | 2/1981 | Warren et al. |

(Continued)

FOREIGN PATENT DOCUMENTS

| WO | 2000/28892 A1 | 5/2000 |
| WO | 2012/063229 A2 | 5/2012 |
| WO | 2017/165532 A1 | 2/2017 |

OTHER PUBLICATIONS

Wood et al., "Strength and Mechanical Properties of Carbon Nanotube Templated Materials," Bulletin of the American Physical Society: Fall 2009 Meeting of the Four Corners Section of the APS, vol. 54, No. 14 (Oct. 24, 2009).

(Continued)

*Primary Examiner* — Daniel H Miller
(74) *Attorney, Agent, or Firm* — Miller IP, LLC

(57) ABSTRACT

A method includes depositing a layer of alumina over a silicon substrate, providing a patterned photoresist over the layer of alumina, providing an iron catalyst layer over the patterned photoresist, providing the iron catalyst layer over an exposed portion of the alumina, providing a first iron catalyst site over a first portion of the alumina, providing a second iron catalyst site over a second portion of the alumina, growing a first carbon nanotube on the first iron catalyst site, growing a second carbon nanotube on the second iron catalyst site, infiltrating the first carbon nanotube and the second carbon nanotube with carbon, and cooling both the first carbon nanotube and the second carbon nanotube. The infiltrating strengthens the first carbon nanotube and the second carbon nanotube to not delaminate from the substrate when the first carbon nanotube and the second carbon nanotube are cooled.

6 Claims, 5 Drawing Sheets

Related U.S. Application Data

(60) Provisional application No. 61/690,222, filed on Jun. 21, 2012.

(51) Int. Cl.

| | | |
|---|---|---|
| *C23C 16/26* | (2006.01) | |
| *C23C 16/01* | (2006.01) | |
| *C01B 32/16* | (2017.01) | |
| *C01B 32/168* | (2017.01) | |
| *C01B 32/178* | (2017.01) | |
| *C01B 32/158* | (2017.01) | |
| *B82Y 30/00* | (2011.01) | |

(52) U.S. Cl.
CPC .......... *C01B 32/168* (2017.08); *C01B 32/178* (2017.08); *C23C 16/01* (2013.01); *C23C 16/26* (2013.01); *B82Y 30/00* (2013.01); *Y10T 428/30* (2015.01)

(58) Field of Classification Search
USPC ....................................................... 428/408
See application file for complete search history.

(56) References Cited

U.S. PATENT DOCUMENTS

| | | | |
|---|---|---|---|
| 5,494,043 A | 2/1996 | O'Sullivan et al. | |
| 5,642,733 A | 7/1997 | Archibald et al. | |
| 6,132,383 A | 10/2000 | Chesney et al. | |
| 6,932,772 B2 | 8/2005 | Kan | |
| 7,022,541 B1* | 4/2006 | Yenilmez | B82Y 35/00 |
| | | | 438/52 |
| 9,554,724 B2 | 1/2017 | Schuessler | |
| 9,603,569 B2 | 3/2017 | Mirov et al. | |
| 9,826,907 B2 | 11/2017 | Magi | |
| 2007/0249916 A1 | 10/2007 | Pesach et al. | |
| 2012/0302117 A1 | 11/2012 | Forest et al. | |
| 2014/0015548 A1* | 1/2014 | Naughton | G01N 27/3278 |
| | | | 324/658 |
| 2014/0094675 A1 | 4/2014 | Luna et al. | |
| 2014/0128753 A1 | 5/2014 | Luna et al. | |
| 2015/0031354 A1 | 1/2015 | Nuss et al. | |
| 2015/0297145 A1 | 10/2015 | Luna et al. | |
| 2015/0374245 A1 | 12/2015 | Szilagyi | |
| 2016/0361029 A1 | 12/2016 | Kang et al. | |

OTHER PUBLICATIONS

Fazio et al., "Material Properties of Carbon-Infiltrated Carbon Nanotube-Templated Structures for Microfabrication of Compliant Mechanisms," Conference Proceedings: ASME 2011 International Mechanical Engineering Congress and Exposition, vol. 11 (Nov. 2011).

Hutchison et al., "Carbon Nanotubes as a Framework for High-Aspect-Ration MEMS Fabrication", Journal of Microelectromechanical Systems, vol. 19, No. 1, (Feb. 2010), pp. 75-82.

Wang et al., "Stress Relief Patterns of Hydrogenated Amorphous Carbon Films Grown by DC-Pulse Plasma Chemical Vapor Deposition", Applied Surface Science, vol. 255, (2008), pp. 1836-1840.

Wei et al., "You are how you sleep: personalized sleep monitoring based on wrist temperature and accelerometer data." DOI 10.4108/eai.20-5-2019.2282879.

* cited by examiner

INFILTRATING CARBON NANOTUBES WITH CARBON TO PREVENT DELAMINATION FROM A SUBSTRATE

CROSS-REFERENCE TO RELATED APPLICATIONS

This application is a continuation of U.S. application Ser. No. 13/924,154, filed Jun. 21, 2013, and claims the benefit of U.S. Provisional Application Ser. No. 61/690,222 filed on Jun. 21, 2012, the entire contents of which are incorporated by this reference.

FIELD OF THE INVENTION

The present embodiments are directed to carbon nanotube structures. More specifically, the present embodiments relate to carbon nanotube structures that are infiltrated with carbon and will not delaminate from the substrate. In some situations, a thin film may be added to these infiltrated carbon nanotube structures and then used as a grid for a Transmission Electron Microscope ("TEM").

DESCRIPTION OF RELATED ART

Carbon nanotubes are allotropes of carbon with a cylindrical nanostructure. These materials generally are "grown", via chemical deposition of carbon, upon a substrate (such as, for example, a silicon substrate). Once created on a substrate, the carbon nanotubes are often referred to as a "carbon nanotube forest."

After producing a carbon nanotube forest, researchers have attempted to "infiltrate" or add various additional chemicals/elements to the carbon nanotube forest. However, if a researcher attempts to add additional quantities of carbon to the carbon nanotube forest (via a chemical deposition process involving ethylene within a heated furnace), the infiltrated carbon nanotubes will generally delaminate (separate) from the substrate upon cooling. Thus, a new method of creating carbon nanotubes infiltrated with carbon is desired. Such a method is disclosed herein.

Additionally, researchers have also been examining new possible materials that may be used as "grids" for a TEM. As is known in the art, a material may be added to a TEM grid and then analyzed using the TEM.

Samples that are prepared for observation and characterization in a TEM must be electron transparent but still be able to be handled and manipulated. Significant efforts are spent preparing specimens, thinning, or devising support mechanisms for specimens in order for TEM to be used. One common method in TEM is the use of metal grids with thin support films bridging the grid gaps. Samples are then deposited on the thin support film for TEM observation. Many varieties of grid materials are available but the most common is copper. Subsequent analysis on the common grids by means of energy dispersive x-ray spectroscopy (EDXS) will be sensitive to the high-Z atoms used in the support grid (for example, the copper) and show unwanted and confusing counts from the support structure. This is especially problematic when analyzing samples that contain either the same elements as the support grid or that have overlap in the EDXS spectra with elements in the support grid.

Metal atoms are also undesirable for applications and sample preparations involving exposure to chemicals or biological agents, where metals can react with the sample or the materials used in preparing the sample. To address this problem, TEM grids from less reactive metals or low-Z elements are also available. However, grids of these materials (such as beryllium or diamond) can be both expensive and/or toxic.

Carbon is a low-Z atom which can be fabricated into three dimensional geometries. Previous attempts to incorporate carbon as a material in TEM grids include: casting carbon fibers in a polyester mold (see e.g., U.S. Pat. Nos. 4,163,900 and 4,250,127), and coating metals in a carbon nanotube (see e.g., Zhang et al., "Superaligned Carbon Nanotube Grid for High Resolution Transmission Electron Microscopy of Nanomaterials," Nano Lett., 8 (8), 2564-2569, 2008). The former have limited chemical resistance, and the latter do not avoid the use of high-Z atoms. The two methods which currently exist for fabricating high-aspect ratio, all-carbon devices are: carbonization of an SU-8 photo-resist (see e.g., Park, B. Y., Taherabadi, L., Wang, C., Zoval, J. & Madou, M. J., "Electrical Properties and Shrinkage of Carbonized Photoresist Films and the Implications for Carbon Microelectromechanical Systems Devices in Conductive Media," J. Electrochem. Soc., 152, J136-J143, 2005), and carbon nanotube templated microfabrication (CNT-M) (see e.g., Hutchinson, O N et al., "Carbon Nanotubes as a Framework for High-Aspect-Ratio MEMS Fabrication," JMEMS, 19, 75, 2010). The carbonization process for the SU-8 structures results in shrinkage of up to 80% of the original dimensions of a structure. This does not allow for accurate dimensional control, an important element in the construction of TEM grids which must fit into a 3.05 mm diameter slot in the TEM stage. CNT-M is a process whereby three-dimensional carbon nanotube structures can be grown from a patterned two-dimensional catalyst layer. However, this technique is also limited in its applications.

Accordingly, there is needed in the art a new method of forming TEM grids with low-Z atoms (such as carbon) which have of controlled geometry which are chemically resistant and devoid of high-Z and metal atom contaminants. Such as method is disclosed herein.

SUMMARY OF THE INVENTION

The present embodiments prevent the spontaneous delamination of highly infiltrated carbon nanotube films and structures. These embodiments reduce stress and prevent stress fracturing and cracking of carbon films (including thin films) that are infiltrated into the carbon nanotube structures. Reducing the stress during infiltration provides a higher strength film or structure. The present embodiments allow for the deposition of large area, thin, suspended films that would be destroyed by other methods.

The process outlined herein may create a 3-Dimensional structure by using carbon nanotube forest growth to convert a two-dimensional lithographically formed pattern of catalyst into the third vertical dimension. Infiltration of the 3-D forest pattern with another material (such as carbon) creates the 3-D solid (or porous) structure.

Carbon nanotubes (also referred to herein as "CNT") may be synthesized as follows. This process may involve thermal chemical vapor deposition ("CVD"), where carbon nanotubes may be grown on prepared silicon wafers by the decomposition of a carbon-containing gas (such as ethylene). The prepared wafers may be patterned with 30 nm of $Al_2O_3$ and 7 nm of Fe using standard photolithography techniques and lift off. CNT growth and infiltration may be done in a 1" tube furnace. After a heating time of 10 minutes in hydrogen (200 sccm), CNT structures may be grown at 750 QC with ethylene (150 sccm) and hydrogen (400 sccm)

gases. ("SCCM" refers to standard cubic centimeters per minute.) In some embodiments, the CNT forests may be cooled. In other embodiments, the CNT forests may be directly infiltrated with carbon at 900 QC in 100 sccm ethylene and 200 sccm argon or hydrogen. Flowing hydrogen during carbon infiltration leaves CNT structures attached to substrate, while flowing argon causes spontaneous release (delamination) upon cooling. Cooling may be done in 250 sccm argon for 15 minutes, at which time the furnace may be opened with argon continuing to flow through the sealed tube until the furnace temperature dropped to 300 QC. The tube may then be opened and the samples removed.

The infiltration process deposits carbon on the nanotubes and may lock them together to make a solid structure. This final structure can be porous or dense depending upon the degree and quality of the infiltration. The deposition also coats non-nanotube regions creating a "floor layer". Samples were etched in a 300 W oxygen plasma at 100 mTorr for 5 minutes to remove the floor layer.

If the infiltrated carbon nanotube structures are to be used for a TEM grid, the following procedure may be used. Specifically, a lithography mask may be prepared where each 4" silicon wafer contained 250 individual TEM grids. The grids are attached together in sets of 8. Grid height was a function of CNT growth time, wherein 3 minutes of growth produces forests approximately 50 μm tall.

As described herein, the grids may be further coated with a thin film that comprises, for example, boron carbide, alumina, silicon dioxide, or carbon.

DESCRIPTION OF THE FIGURES

The following figures form part of the present specification and are included to further demonstrate certain aspects of the present invention. The invention may be better understood by reference to one or more of these figures in combination with the detailed description of specific embodiments presented herein.

DETAILED DESCRIPTION OF THE INVENTION

While compositions and methods are described in terms of "comprising" various components or steps (interpreted as meaning "including, but not limited to"), the compositions and methods can also "consist essentially of" or "consist of" the various components and steps, such terminology should be interpreted as defining essentially closed-member groups.

Figure 1:
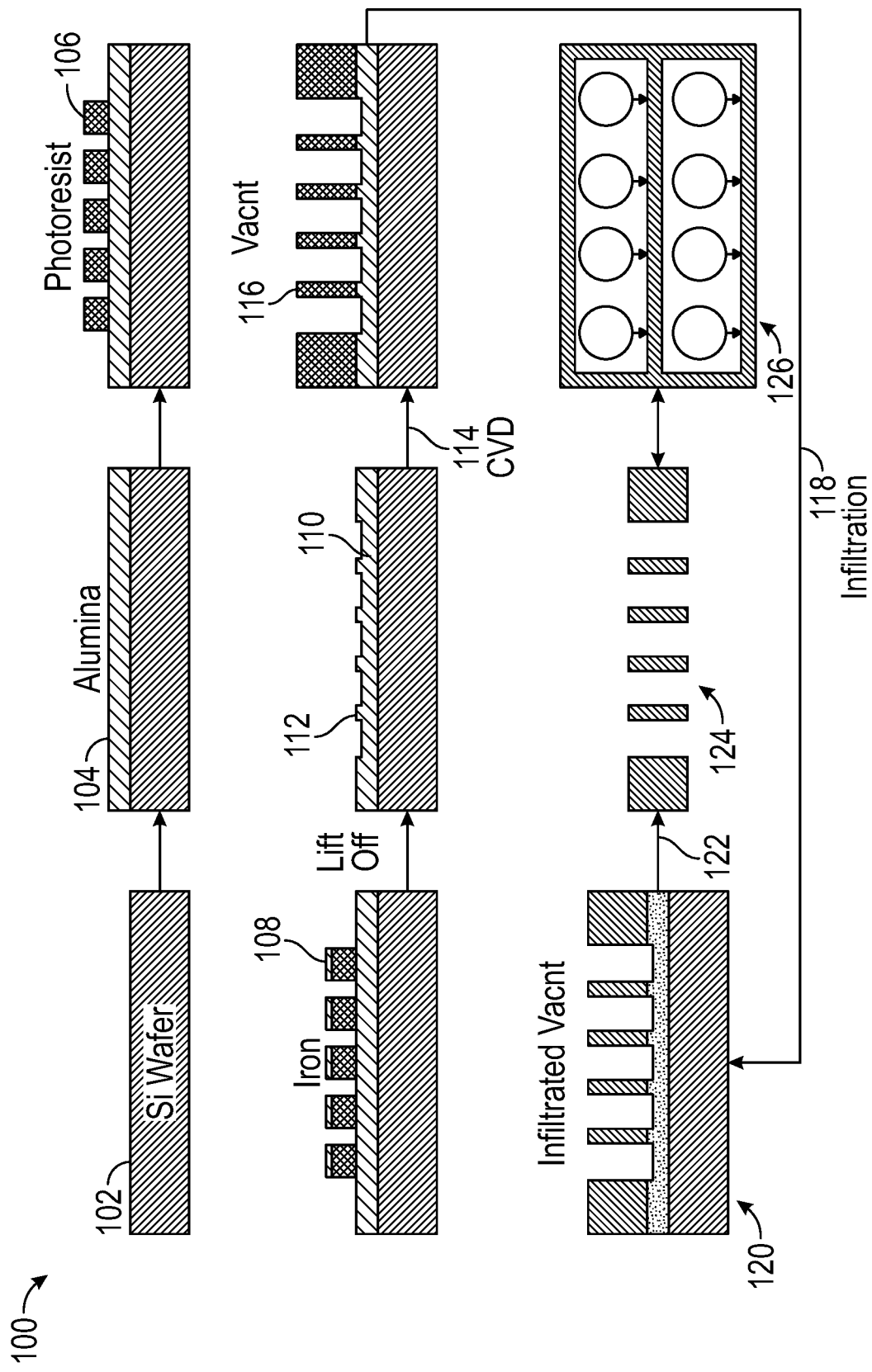
FIG. 1 shows a flow diagram of a process for growing and infiltrating carbon nanotubes via a chemical deposition process.

Referring now to FIG. 1, a flow diagram illustrates a method 100 of creating and infiltrating carbon nanotubes. Specifically, in this method, a carbon vapor deposition (CVD) procedure is used. First a substrate 102 is obtained. In the embodiment shown in FIG. 1, the substrate comprises a silicon wafer. Those skilled in the art will appreciate that other materials may be used as the substrate 102. The substrate 102 may then be coated with alumina, as shown by numeral 104. More specifically, the substrate 102 may be patterned with alumina (such as, for example, 30 nm of $Al_2O_3$). (Blanket layers of alumina, as shown in FIG. 1, can also be used.) Once coated, the substrate 102 may be subjected to a lithography procedure 106 for creating a patterned iron catalyst layer 108. In the embodiment shown in FIG. 1, 7 nm of Fe is applied. Those skilled in the art will appreciate that standard photolithography techniques and standard lift off 110 or other pattern transfer methods may be used. Once the lift off procedure has occurred, the iron catalyst 108 is positioned on the wafer 102 in a position that will foster carbon nanotube growth in the desired pattern.

In some embodiments, the wafer 102 with the iron catalyst 108 may be made in the manner outlined above. In other embodiments, the wafer 102 in this form may be purchased or otherwise obtained. In order to grow carbon nanotubes on the wafer 102, a CVD process (as shown by arrow 120) is performed. Specifically, CNT growth occurs, for example, in a 1" tube furnace with a heating time of 10 minutes. Hydrogen gas is added at 200 sccm. To this mixture, ethylene is added. CNTs were grown at 750° C. with ethylene (150 sccm) and hydrogen (400 sccm) gases. (The temperature may range from 600 to 900° C. in other embodiments.) It should be noted that during this growth process, the hydrogen gas interacts with the Fe catalyst to promote CNT growth and operates to keep the catalyst active during the process. The CNTs grow at the catalyst sites. When the CNTs are grown, they have a density of about 1% carbon and are generally held in place by weak Van der Waals attraction. The CNTs are shown as structure 130 in FIG. 1. As shown in FIG. 1, the CNTs generally grow perpendicular to the catalyst sites.

Once the CNTs have been grown or otherwise obtained (such as, for example, via purchasing), it may be desirable (in some embodiments) to infiltrate these CNTs 130 with an additional amount of carbon or with an additional material. The infiltration process is shown as arrow 150 and is described below.

CNT forests 130 may be infiltrated with carbon at 900° C. in 100 sccm ethylene and 200 sccm argon or hydrogen. (The temperature may range from 800 to 1100° C. in other embodiments. The time used for infiltrating may be between, for example, 1 minute and 24 hours and the total flow of hydrogen may be between 100 to 1000 sccm.) Flowing hydrogen during carbon infiltration leaves CNT structures 130 attached to substrate 102, while flowing argon (without hydrogen) causes spontaneous release (delaminate) upon cooling. The infiltrated structures are then cooled and removed from the furnace. Cooling may be accomplished in 250 sccm argon for 15 minutes, at which time the furnace was opened with argon continuing to flow through the sealed tube until the furnace temperature dropped to 300° C. The tube may then be opened and the samples removed. As noted above, the use of hydrogen during the infiltration process can produce infiltrated CNT structures that will not delaminate (separate) from the substrate upon cooling. Without being bound by theory, it is believed that the presence of the hydrogen during the infiltration process either reduces the stress or better adheres the infiltrated CNT structure to the substrate.

The infiltration process deposits carbon (or some other material) on the nanotubes. This process may also deposit the carbon/other material on the substrate. The infiltration process may lock the CNTs together to make a solid structure. This final structure can be porous or dense depending upon the degree and quality of the infiltration. The deposition may also coat non-nanotube regions creating a "floor layer". The infiltrated samples may then be etched in a 300 W oxygen plasma at 100 mTorr for 5 minutes to remove the floor layer, as shown by arrow 160.

Figure 2:
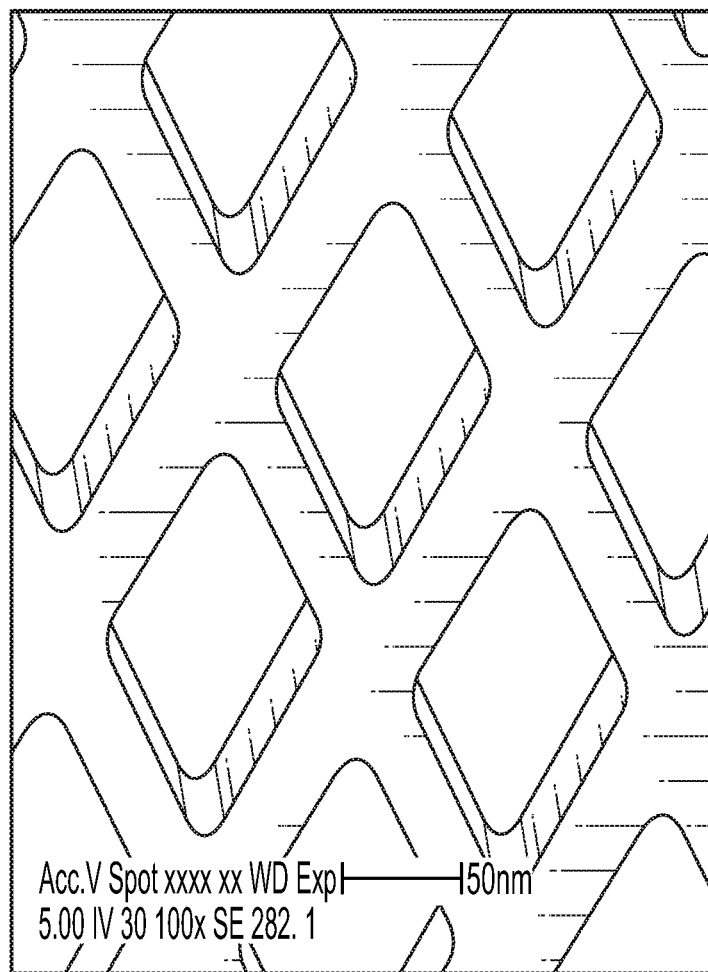
FIG. 2 shows an SEM image of fabricated TEM grids that are made of carbon nanotube structures that were infiltrated according to the methods outlined herein.

After the CNT structures have been partially or substantially infiltrated, they may be used for a variety of different applications including MEMS (microelectromechanical systems) and other devices (such as sensors, actuators, microsieves, or microfilters) that utilize carbon-infiltrated carbon nanotube (CNT) structures. Partially infiltrated CNT structures may then have additional processing steps performed on them possibly including the following: chemical vapor deposition, additional chemical vapor infiltration with another material, liquid based deposition including electrochemical deposition, liquid based infiltration including electrochemical infiltration, further patterning, and/or polishing. These processing steps may ultimately involve burning out the CNT and deposited carbon (in a high temperature oxygen containing environment) leaving only subsequently deposited inorganic layers. The infiltrated CNT structures may also be used as grids for TEM measurements. In fact, the embodiment shown in FIG. 1 has been particularly designed such that the infiltrated CNT structures may be used as a TEM grid. In this embodiment, a lithography mask is used. Each 4" silicon wafer contained 250 individual TEM grids. The grids are attached together in sets of 8 as seen in FIG. 1. FIG. 2 shows an SEM image of the fabricated grids. Grid height was a function of CNT growth time with 3 minutes of growth produced forests approximately 50 μm tall.

As noted above, the process described above for infiltrating CNT structures with carbon (using a flow of hydrogen) has value by itself. At the same time, the CNT structures made using this process may further be used to add a thin film to the CNTs. CNT structures with a thin film added thereto is useful for a variety of applications, including x-ray windows, MEMS microphones and pressure sensors, heaters, and other devices. Moreover, as described above, the addition of a thin film to CNT structures may be particularly appealing in the construction of TEM grids, as it may allow the grid to be made without copper, expensive diamond or beryllium, etc.

Figure 3:
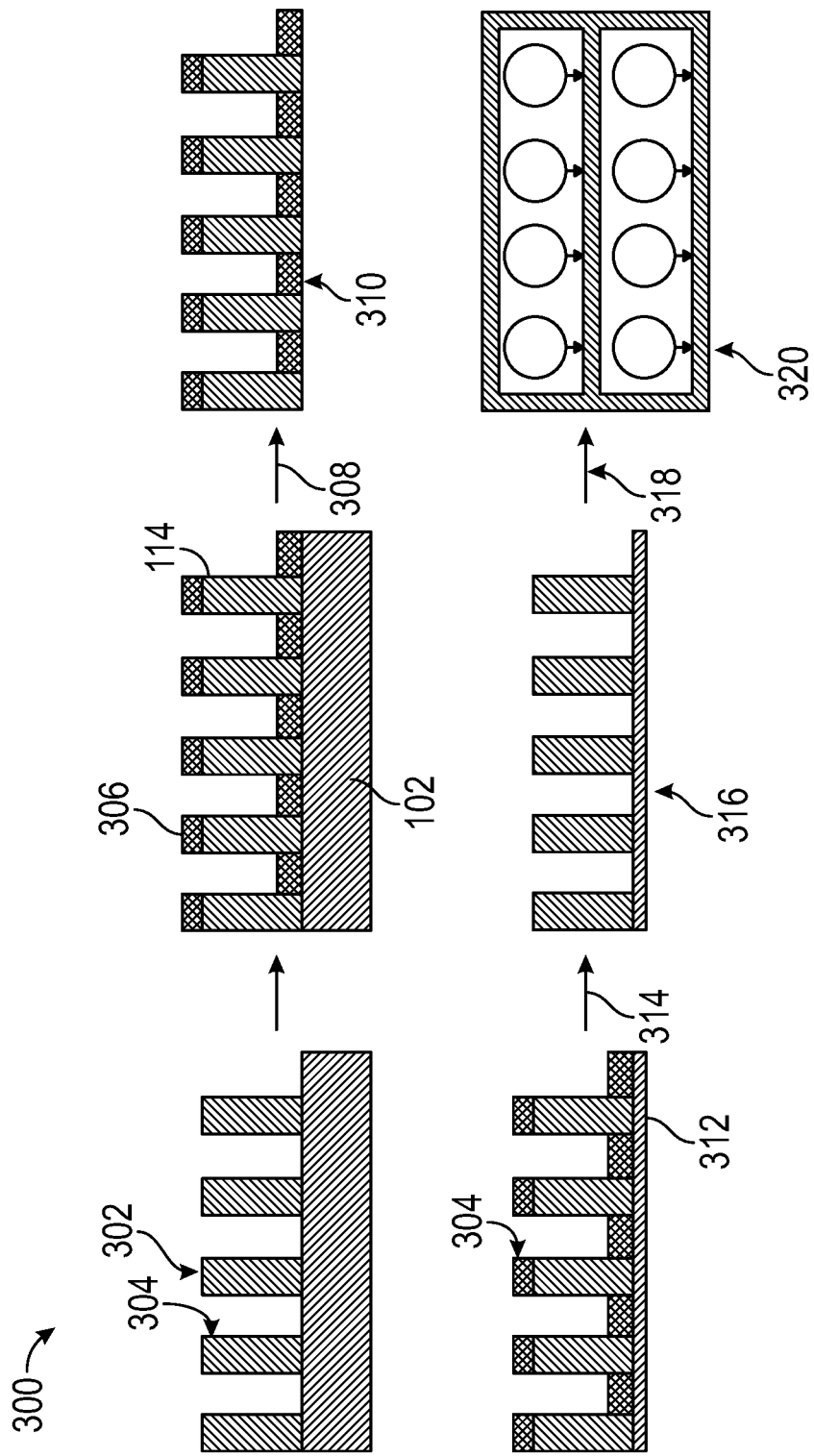
FIG. 3 shows a flow diagram of how a thin film may be attached to a carbon nanotube structure according to the present embodiments.

The process 300 by which thin films may be added to the CNT structures and the gaps between regions will now be described in conjunction with FIG. 3. As shown in FIG. 3, a quantity of CNTs will be obtained 310. In some embodiments "obtaining" 310 the CNTs may involve constructing and/or infiltrating the CNTs using the processes outlined herein. In other embodiments, the "obtaining" of the CNTs may involve purchasing or otherwise acquiring these structures. Other structures on substrates with that surface being defined by the substrate surface may also be used.

Once the CNTs have been obtained, a protective layer 312 may be added. (This protective layer is a "sacrificial" layer, as will be described herein.) This layer may be between 1-1000 microns in thickness. In some embodiments, the layer 312 may be made of Formvar (0.5% solution prepared in 1,2-Dichloroethane), or some other polymer. (Formvar is commercially available from many sources and is used in TEM grids. Formvar is generally made of formals of polyvinyl alcohol.) Various methods may be used to deposit the layer 312 including ultrasonic spraying, drip coating, spin coating, etc. The layer 312 is also added to the gaps 351 between the nanotubes 130.

In the embodiment shown in FIG. 3, the layer 312 is added while the CNT structures 130 are still attached to the flat silicon substrate 102. The protective layer 312 covers both the substrate 102 and the CNTs 130 (and any other exposed silicon surfaces). Once covered with the layer 312, the substrate 102 may be removed, as shown by arrow 330. Such removal of the substrate 102 may occur by placing the substrate 102 in HF (1-100% diluted in water) for 10 minutes and then rinsing with deionzied water for 10 minutes.

A thin film 341 may then be directly deposited onto the substrate-defined side of Formvar coated structures. Those skilled in the art are familiar with the techniques needed to apply the film, given the present disclosure. The structures can then be thermally annealed in argon, or another inert gas, or immersed in a solvent to remove the polymer protective layer 312, as shown by arrow 350. The resulting structure is a thin film 341 applied to the CNTs 130. The thin film 341 is suspended, as shown by FIG. 3. The thin film is also applied to the gaps 351 that are between the nanotubes 130.

Another embodiment of the way in which the thin film may be attached to CNT structures will now be described. This process allows direct application of the film to many grid supports or other CNT structures at the same time. In this process, a thick sacrificial layer is deposited on the structures while they are still attached to the flat silicon substrate. This covers both the grids and within the grid holes. Removal of the grids and sacrificial layer gives a flat surface on the wafer side of the structure. Deposition of the thin membrane is on that flat surface. The sacrificial layer is then removed.

The sacrificial layer is a 0.5% solution of Formvar powder prepared in 1,2-Dichloroethane. Formvar was sprayed onto TEM grids, still attached to the silicon substrate, by an ultrasonic sprayer. Samples were placed in 49% HF for 10 minutes, rinsed in DI (deionized) water for 10 minutes, and removed from substrate. Thin films were then directly deposited onto the substrate-defined side of Formvar coated grids.

Figure 5:
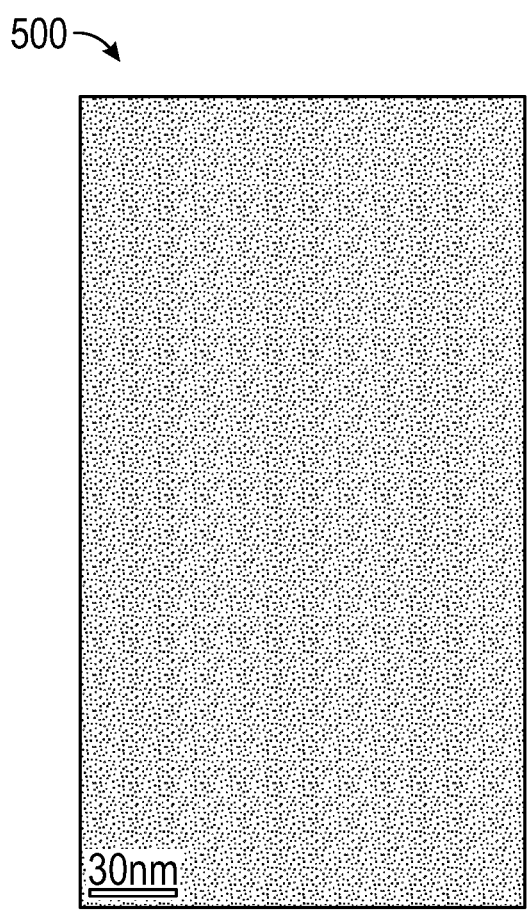
FIG. 5 shows an HRTEM (High Resolution Transmission Electron Microscope) image of a 25 nm thick boron carbide film deposited according to the present embodiments, wherein this Figure shows a lack of crystalline structure and was taken at 200 keV.

Carbon films were sputtered in a Kurt Lesker PVD-75 system. Silicon dioxide and aluminum oxide films were deposited by a Denton E-Beam Evaporator. Boron Carbide films were deposited by magnetron sputtering. TEM analysis of thin films shows amorphous structures with good electron transmission (see FIG. 5). Grids were annealed in argon at 400° C. for 15 minutes to remove the sacrificial layer.

Figure 4A:
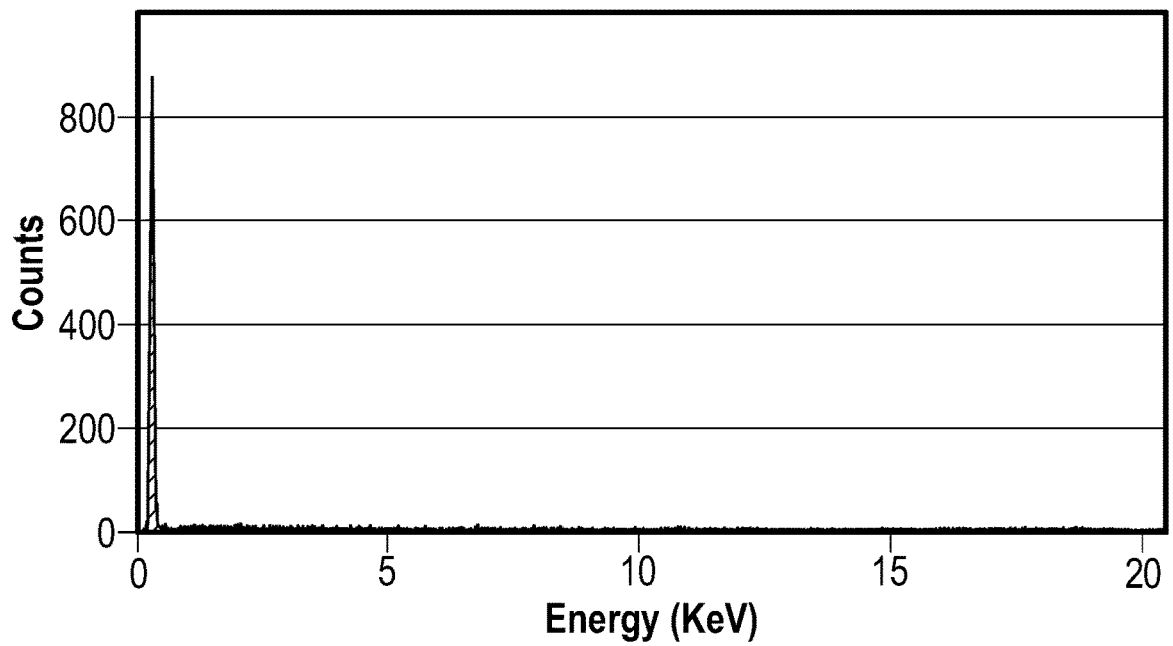
FIG. 4 is a graph shown 100s of XRD (X-ray diffraction) data collected from all-carbon TEM grid made according to the present embodiments (top), and a commercial copper grid (bottom)
Figure 4B:
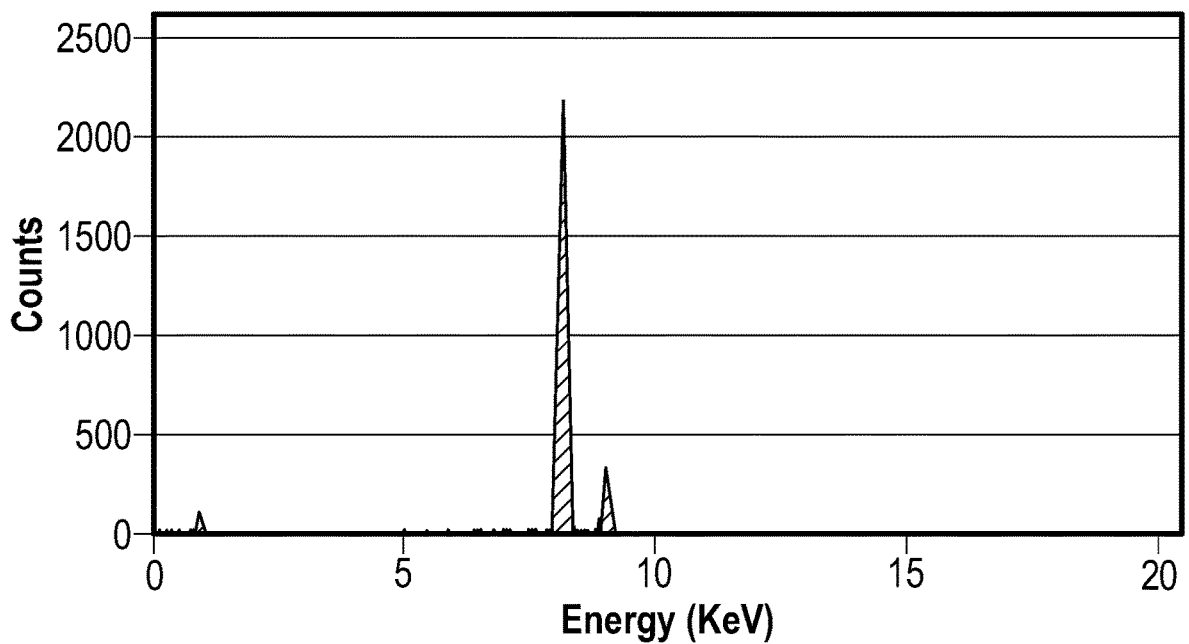

Chemical testing was performed by placing grids in KOH, HCl, or HF solutions for several hours. Grids were then rinsed in deionized water for 10 minutes. TEM characterization, along with collection of EDXS and EELS (Electron Energy Loss Spectroscopy) data, were done in a Tecnai F20 TEM. Thin films were deposited on glass slides and thickness confirmed by characterization on a Veeco Dimension 5 AFM. EDXS analysis of grids showed carbon peaks with no other atomic signatures (See FIG. 4). This indicated the absence of the Fe growth catalyst and $Al_2O_3$ diffusion barrier used during the growth process. Chemically tested grids showed no measurable deformation or change in mechanical properties of the grid. EDXS detected no non-carbon signature after chemical tests.

Force testing has been conducted to determine the materials properties of CNT-M structures. (See e.g., Fazio, W et al. "Material Properties of Carbon-Infiltrated Carbon Nanotube-Templated Structures for Microfabrication of Compliant Mechanisms," ASME Proc., 2011.) This testing has confirmed a yield tensile strength of 110 MPa and a Young's modulus of 6 GPa. Bulk copper is known to have a yield tensile strength of 70 MPa and a Young's modulus of 117 GPa.

It should be noted that carbon grids, of the type made according to the present embodiments, may be more resistant to bending than metal grids. However, carbon grids may break under the same applied force that would cause metal grids to bend or crease. Carbon grids may be more chemically resistant than metal grids, and may contain no detectable high-z atoms. The microfabrication process used to make the grids may allow reliable control over the dimensions of the grid. The microfabrication process also may allow control over the number of grids that are locked together during growth and processing. Further, the thin film deposition method outlined herein requires very little handling, and allows for processing large batches of grids. This method has been successfully shown to produce thin, suspended films with thicknesses from 10-25 nm. This method may be preferable to the current method for depositing thin films on TEM grids, as it is scalable and poses less risk of damaging grids due to handling.

The present embodiments may also allow for construction of TEM grids that are composed entirely of carbon. These grids are more resistant to bending than commercially available grids, have a greater tensile strength, and can be made and processed in batches. As outlined herein, such grids may be coated (with a thin film) that is made of amorphous carbon, alumina, silicon dioxide, and/or boron carbide thin films. Obviously, applying different materials as the films for TEM grids will result in different surface chemistry and may result in better TEM measurements (depending upon the particular sample, etc.).

The present embodiments relate to a variety of different methods. For example, a method of adding a thin film to carbon nanotubes is disclosed. This method comprises obtaining a quantity of carbon nanotubes attached to a substrate and then coating the carbon nanotubes with a protective layer. In some embodiments, the protective layer may be Formvar or another polymer. The substrate may be coated with the protective layer in addition to the coating of the carbon nanotubes. The substrate may then be removed from the coated carbon nanotubes. A thin film may then be deposited on the coated carbon nanotubes. In some embodiments, the thin film is selected from the group consisting of amorphous carbon, silicon dioxide, alumina and boron carbide. Once the thin film is added, the protective layer may be removed, thereby resulting in a thin film that is suspended on the carbon nanotubes. In some embodiments, the protective layer may be removed by thermal annealing in an argon atmosphere. In other embodiments, the protective layer may be removed by immersion in a solvent. In some embodiments, the carbon nanotubes that include the thin film are used as a Transmission Electron Microscope grid.

Another method is a method for infiltrating carbon (or another material) onto carbon nanotubes. This method involves obtaining carbon nanotubes on a substrate. In some embodiments, this obtaining may involve forming the carbon nanotubes and/or purchasing the carbon nanotubes. Once the nanotubes are obtained, the carbon nanotubes may be heated with ethylene gas and hydrogen gas within a furnace. This heating may occur, for example, to a temperature of about 900° C. (or more generally, between 800 to 1100° C.). When the nanotubes are heated with ethylene and hydrogen, the carbon nanotubes do not delaminate from the substrate when they are removed from the furnace. If hydrogen is omitted from this heating step (e.g., the heating during the infiltration process), the nanotubes will delaminate from the substrate upon cooling. Thus, by adding hydrogen to the infiltration step, significant advantages may be obtained. As noted above, the obtaining of the carbon nanotubes may involve forming the nanotubes. Such forming of the nanotubes involves obtaining a substrate comprising silicon and then forming the carbon nanotubes by a first deposition of vaporized carbon onto the substrate using a catalyst, wherein hydrogen gas is present during the depositing, and then cooling the carbon nanotubes.

It should be noted that some of the present embodiments have been directed carbon nanotube structures that have gaps, and more particularly, to ways in which a thin film may be "suspended" across the gaps and added to the carbon nanotube structure. This disclosure involving carbon nanotubes is not limiting. Other structures having gaps may be used instead of carbon nanotubes and those disclosures regarding coating the structure having gaps with a protective layer, removing the substrate, adding the thin film to the structure (and the gaps) with the thin film and then removing the protective layer apply equally to carbon nanotube structures and to other structures that also have gap (that may not be carbon nanotube structures).

All of the articles and patents cited herein are expressly incorporated herein by reference.

All of the compositions and/or methods and/or processes and/or apparatus disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and/or apparatus and/or processes and in the steps or in the sequence of steps of the methods described herein without departing from the concept and scope of the invention. More specifically, it will be apparent that certain agents which are both chemically and physically related may be substituted for the agents described herein while the same or similar results would be achieved. All such similar substitutes and modifications apparent to those skilled in the art are deemed to be within the scope and concept of the invention.

The invention claimed is:

1. A carbon nanotube (CNT) grid, comprising: a first carbon nanotube, comprising:
    a first top surface; and a first bottom surface;
    a second carbon nanotube vertically aligned with the first carbon nanotube, the second carbon nanotube comprising:
    a second top surface; and
    a second bottom surface, wherein the first carbon nanotube and the second carbon nanotube are infiltrated with carbon by a mixture that is flowing and having a temperature between 800 and 950 degrees Celsius, the mixture comprising:
    a first amount of ethylene between 150 standard cubic centimeter per minute (sccm) and 200 sccm; and
    a second amount of hydrogen between 100 sccm and 200 sccm, wherein the hydrogen is 25-75% of the flow, wherein infiltrating the first carbon nanotube and the second carbon nanotube with carbon causes the first carbon nanotube and the second carbon nanotube to have carbon deposits formed thereon and to not delaminate from a substrate during cooling subsequent the infiltrating; and a thin film extending along the first bottom surface and the second bottom surface, wherein the thin film is suspended between the first carbon nanotube and the second carbon nanotube.

2. The CNT grid of claim 1, wherein the thin film comprises a carbon film.

3. The CNT grid of claim 1, further comprising a sacrificial layer disposed between the thin film and both the first bottom surface of the first carbon nanotube and the second bottom surface of the second carbon nanotube, wherein the sacrificial layer comprises a thickness of 1-1000 microns.

4. The CNT grid of claim 1, wherein the first carbon nanotube and the second carbon nanotube are further infiltrated with an additional material other than carbon by chemical vapor deposition, and the thin film comprises a silicon dioxide film, an aluminum oxide film, or a boron carbide film.

5. The CNT grid of claim 1, further comprising a yield tensile strength of 110 megapascals (MPa) and a Young's modulus of 6 gigapascals (GPa).

6. The CNT grid of claim 1, wherein the thin film comprises carbon to increase resistance to bending of the TEM grid.

* * * * *